United States Patent [19]

Brown et al.

[11] Patent Number: 5,089,948

[45] Date of Patent: Feb. 18, 1992

[54] HIGH SPEED OPTOISOLATOR SWITCHING APPARATUS

[75] Inventors: Peter J. Brown, Springfield, Mass.; Suresh Hariharan, Orchard Park, N.Y.

[73] Assignee: Digital Equipment Corporation, Maynard, Mass.

[21] Appl. No.: 546,117

[22] Filed: Jun. 29, 1990

[51] Int. Cl.⁵ .............................................. H03K 5/08
[52] U.S. Cl. ..................................... 363/58; 323/902; 361/91; 361/111; 250/551; 307/311
[58] Field of Search ................................ 363/50-58; 323/902; 361/18, 90, 91, 111, 175, 176; 364/184; 307/139, 140, 117, 125, 311; 250/208.4, 551

[56] References Cited

U.S. PATENT DOCUMENTS 4,238,696 12/1980 Smart .............................. 307/311 X
4,319,145 3/1982 Apfelbeck ........................... 307/311

Primary Examiner—R. Skudy
Assistant Examiner—Emanuel Todd Voeltz
Attorney, Agent, or Firm—John G. Mesaros; Ronald E. Myrick

[57] ABSTRACT

An electrically isolated high speed optical switching arrangement for use as a computer over-voltage sensing circuit utilizing first and second optoisolator devices, the first having an input, a first signal from the output of a bus sensing circuitry which provides two complementary outputs, with the output voltage of the optoisolator controlling power-down circuitry for the computer in response to an over-voltage condition. A second control optoisolator has its output in parallel with a resistor in the base to emitter path of the first optoisolator. The complementary signal of the bus-sensing circuitry provides the input to the second optoisolator. During normal power conditions, the first optoisolator is conductive and the second is non-conductive. As an over-voltage condition occurs, the second optoisolator is driven into conduction, thereby effectively providing a shunt across the resistor of the first optoisolator while the first optoisolator is shut off to instantaneously terminate conduction of the first optoisolator and provide an output signal to the power-down circuitry for shutting down the power in response to the over-voltage condition.

13 Claims, 3 Drawing Sheets

HIGH SPEED OPTOISOLATOR SWITCHING APPARATUS

BACKGROUND OF THE INVENTION

This invention relates to electrically isolated high speed optical switching circuits, and more particularly to an optoisolator circuit for an over-voltage protection module in a computer system.

During computer operation certain adverse conditions may occur. In one instance, referred to as a so-called crowbar event, an over-voltage situation is in progress. During a crowbar event, the power system output voltage is in the process of increasing to an unacceptable level.

The response to such an over-voltage is to power down the voltage bus. Time is of the essence in powering down the voltage to avoid placing excessively high voltages on critical semiconductor components beyond design rating. The critical point in such power down situations requires that the power-down occurs before the over voltage reaches a dangerous level. The time frame is measured in tens of microseconds.

Circuitry must be provided to sense this over-voltage condition and instantly produce a shut down condition. What typically happens is that during an over-voltage condition the power system output voltage starts ramping up to a high and unacceptable voltage. Over-voltage sensing circuitry then responds to this ramped up increase in voltage and after processing through some logic, this sensed condition or signal is transmitted through an optical coupler circuit to another module which shuts down the power supply, thereby stopping the over-voltage condition.

Over-voltage situations readily occur during component failure or feedback loop malfunctions or malfunction of bus structures and subsystems. In one typical computer configuration, in connection with the bus structure, there may be five converters set up in parallel with one feedback loop through a regulator intelligence card. In this configuration, the feedback loop is connected through a small twisted pair of cable. Failure of this small twisted pair cable can readily result in an over-voltage condition, where the converters lose their feedback loop, whereupon the converters run open loop, resulting in ever increasing voltages which can result in component failure. Such cable failure can result from actual breakage or even solder joint disconnection or physical jarring loose of the connection.

This over-voltage sensing circuitry will normally be included as part of the power supply module or power system. In such circuitry, as part of the over-voltage sensing, an optoisolator is employed. However, with a single optical coupler, or optoisolator, a significant, unacceptable delay occurs, in the order of fifty microseconds. With a design goal of maintaining the bus voltage at or below a seven volt level at all times, such a delay, under certain conditions, could cause the voltage to approach eight volts in a time span which is substantially less than fifty microseconds, which proves to be unacceptable. Much of this delay has been attributable to time delays inherent in the optoisolator device.

Other devices which could be utilized in place of the optoisolator include pulse transformers, which tend to be exceptionally expensive and require a lot of support circuitry.

In accordance with an aspect of the invention a new and improved instantaneously operating optoisolator switching circuit is provided.

SUMMARY OF THE INVENTION

The foregoing and other objects of the instant invention are accomplished by providing an over-voltage sensing circuit utilizing first and second optoisolator devices, the turn-on characteristics of which are faster than the turn-off characteristics. A first output optoisolator device has, as an input, a first signal from the output of a bus sensing circuitry which provides two complementary outputs. The output voltage of the optoisolator is sensed by power-down circuitry which shuts off power in response to an over-voltage condition. A second control optoisolator device has the output thereof in parallel with a resistor in the base-to-emitter path of the first optoisolator. The complementary signal of the bus-sensing circuitry provides the input to the second optoisolator. During normal power conditions, the first optoisolator is conductive and the second is non-conductive. As an over-voltage condition occurs, the first optoisolator is turned off while the second optoisolator is driven into conduction, thereby effectively providing a shunt across the resistor of the first optoisolator to instantaneously terminate conduction of the first optoisolator and provide an output signal to the power-down circuitry for shutting down the power in response to the over-voltage condition.

Other objects, features and advantages of the invention will become apparent from a reading of the specification when taken in conjunction with the drawings in which like reference numerals refer to like elements in the several views.

DESCRIPTION OF THE PREFERRED EMBODIMENT

Figure 1:
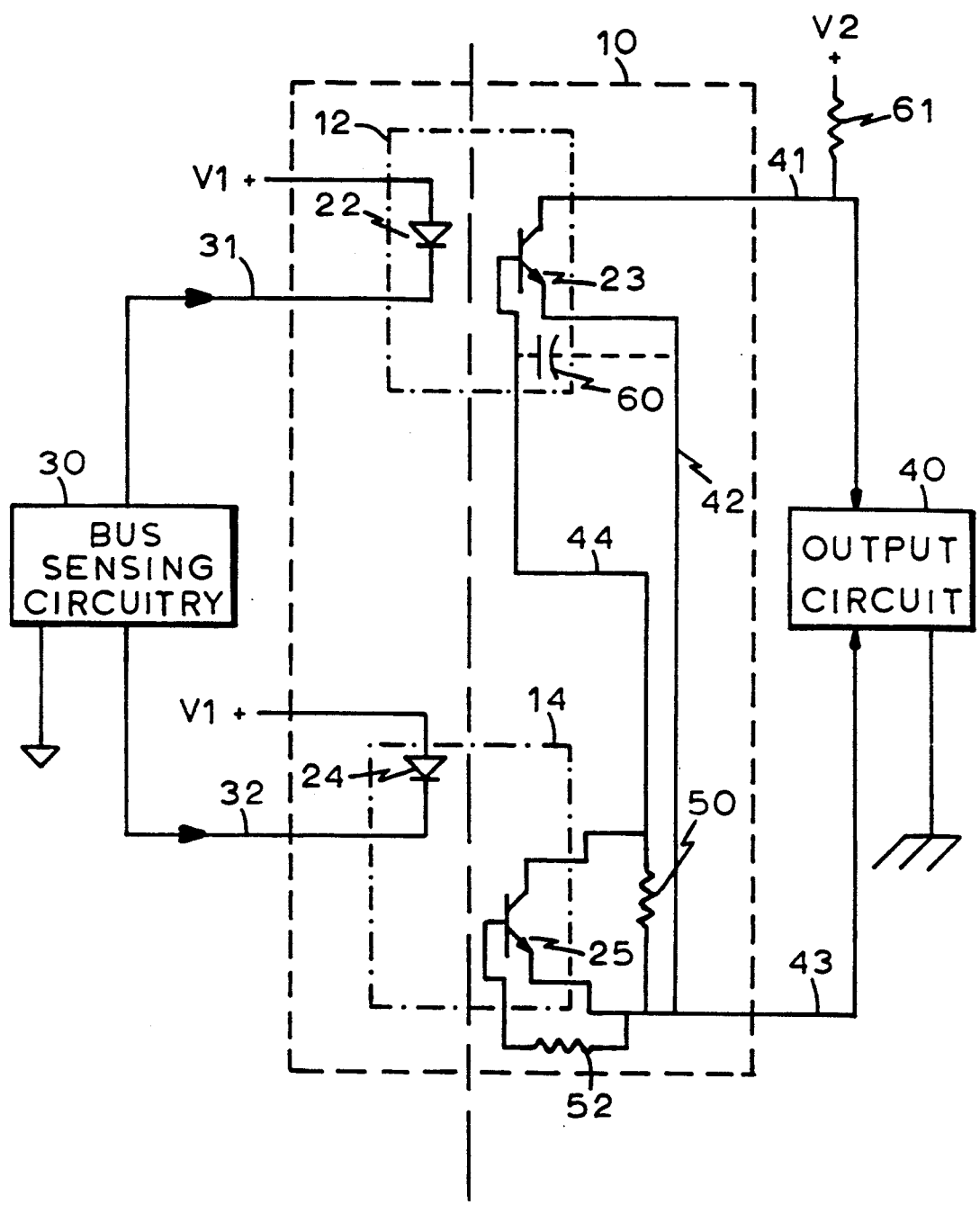
FIG. 1 is a schematic diagram of the over-voltage sensing circuitry according to the invention.

Referring now to the drawing, and particularly to FIG. 1, there is shown an optoisolator circuit, enclosed in broken lines and generally designated 10, which includes first and second optoisolators 12 and 14, each of which is likewise enclosed in broken lines and which, in the instant embodiment, are generally identical. Each optoisolator includes a light emitting diode or LED and a transistor, that is, optoisolator 12 includes diode 22 and transistor 23, while optoisolator 14 includes diode 24 and transistor 25.

With an optoisolator 12 or 14, when current through LED 22 or 24, respectively, ceases, the internal light is extinguished and the device's energy is suspended. With the light extinguished, stimulation for the associated light-sensitive transistor 23 or 25, respectively, ceases and, ideally, the transistor switches to the so-called cut-off state which exhibits an extremely low collector-to-emitter current and a high collector to emitter output voltage. However, in practical situations there is an internal time delay during the switching to the cut-off state.

External to the optoisolator circuit at the input end there is a bus sensing circuitry 30, from which the bus voltage condition is constantly monitored. Connected to the output of the optoisolator circuitry is an output circuit 40 which includes logic performing the shut down of the power system when an over-voltage condition occurs. The output circuit 40 is typically another printed circuit board or module, which includes a pull up resistor 61 as the input component for driving the logic for shutting down the power system.

The bus sensing circuitry 30 provides two different signals which are 180 degrees out of phase, these two signals appearing as current signals transmitted over leads 31 and 32. The lead 31 is coupled to the cathode of diode 22 with the anode thereof coupled to a positive source of voltage V1. The signal over lead 32 is coupled to the cathode of diode 24 with the anode thereof coupled to a positive source of voltage V1. Due to this connection, when one diode is conducting the other is non-conducting.

In the preferred embodiment, to effect two signals appearing on leads 31 and 32 which are 180 degrees out of phase, that is, mutually exclusive signals, a D type flip flop is employed as the output device in the bus sensing circuitry 30. A flip flop has complementary states or outputs, that is, it has the Q and "Not Q" outputs, or, in other words, it always has a 1 output, with the other output being a 0 output, and vice versa.

Within the optoisolator circuit 10, transistor 23 of optoisolator 12 is an NPN transistor, with the collector thereof coupled over lead 41 to a positive source of voltage V2 and simultaneously to the output circuit 40. The emitter of transistor 23 is coupled over lead 42 to the emitter of NPN transistor 25 which, in turn, is coupled over lead 43 to the output circuit 40. The base of transistor 23 is coupled over lead 44 to the collector of transistor 25, with the collector in turn being coupled to one end of a resistor 50, the other end of which is coupled to both lead 43 and the emitter of transistor 25. A second resistor 52 is coupled between the base and emitter of transistor 25. The input to the output circuit 40 is controlled by the collector to emitter voltage output of transistor 23 of optoisolator 12, this input being that which appears on leads 41, 43.

Shown in broken lines is a capacitor 60 between the base and emitter of transistor 23, this capacitor designating the internal capacitance of the transistor 23, which capacitance must be taken into consideration in the design and operation of the over voltage sensing circuit as will be hereinafter described. Briefly, this capacitance 60, in conjunction with resistor 50, produces an R-C time constant which dictates the turn-off time of the optoisolator 12.

The utilization of optoisolators in this situation provides electrical isolation between circuits The most important characteristic is the ability of the optoisolator to electrically isolate its input circuit from its output circuit. This characteristic is of importance in instances when different circuits, which must be coupled, are in different locations or on different boards, and each location may have, intentionally or unintentionally, different ground reference points. In this particular application, the output circuit 40 which controls power-downs, is located on a different printed circuit board from the optoisolator circuit 10, and may occasionally (and without warning) exhibit a different ground potential. Also, optically isolating different circuits can cut ground loops. To avoid damage as a consequence of different grounding schemes or different ground references in different parts of the circuit, electrical isolation is required as part of the design. In FIG. 1, a vertical line of alternate length dashes indicates the required electrical isolation between the left and right sections of the optoisolator circuit 10.

Figure 2:
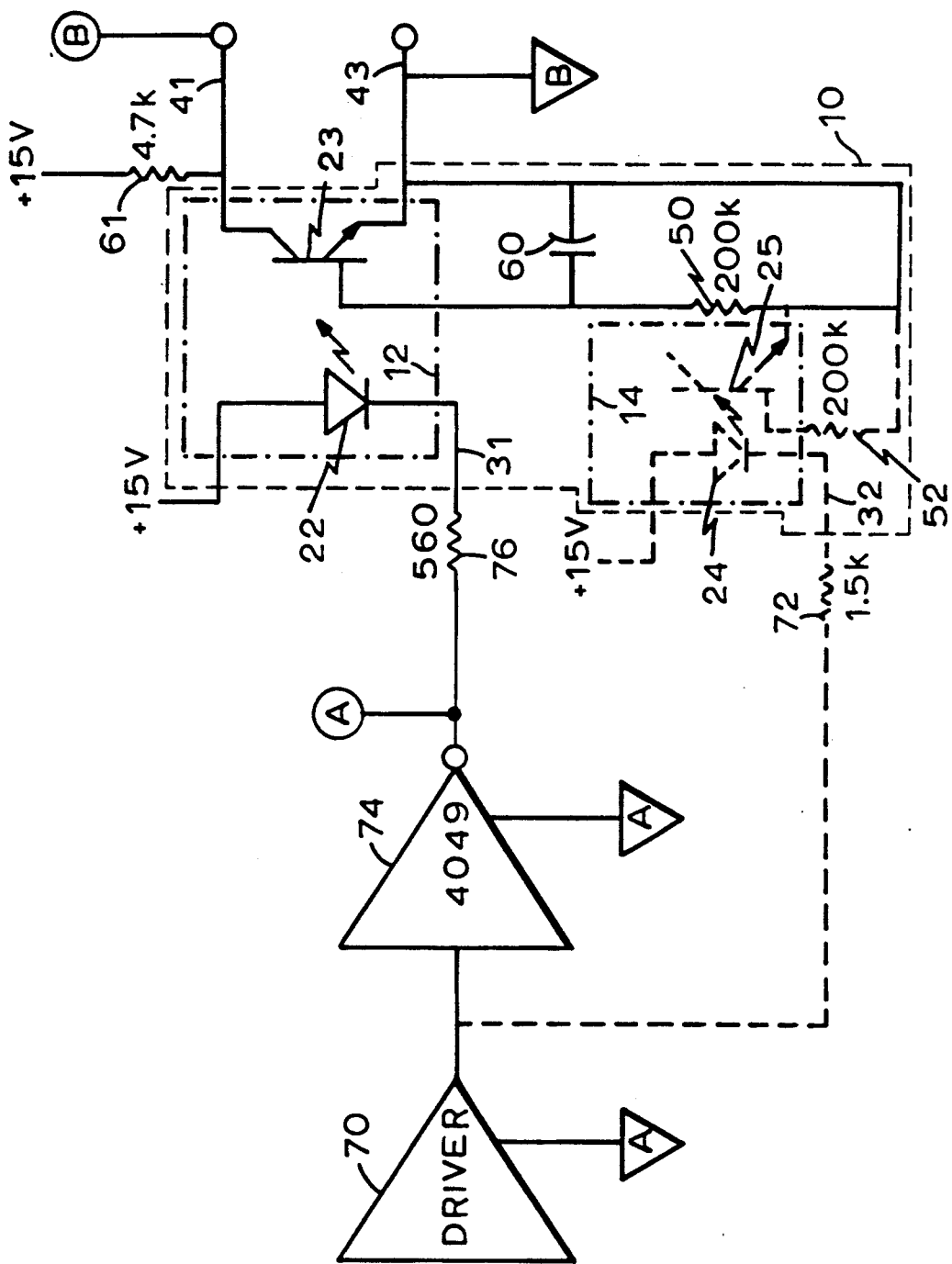
FIG. 2 is a schematic diagram of a test circuit utilized to determine the response characteristics of the circuit of FIG. 1.
Figure 3:
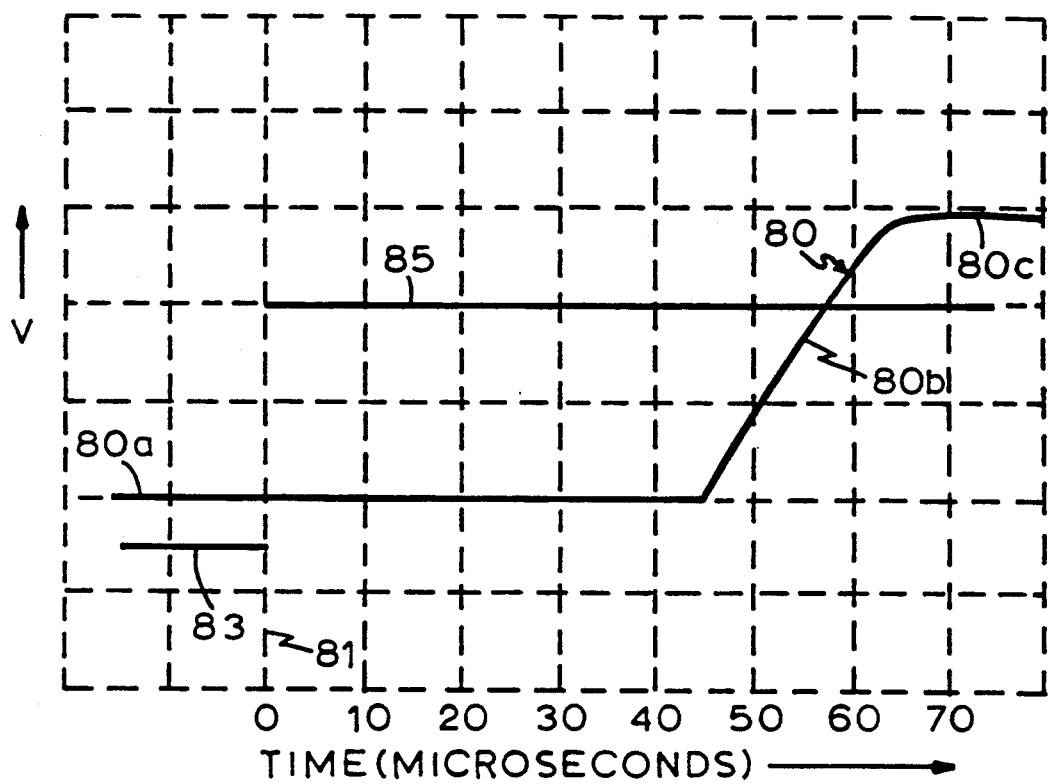
FIG. 3 is a response curve for a single optical isolator device over-voltage sensing circuit previously used.
Figure 4:
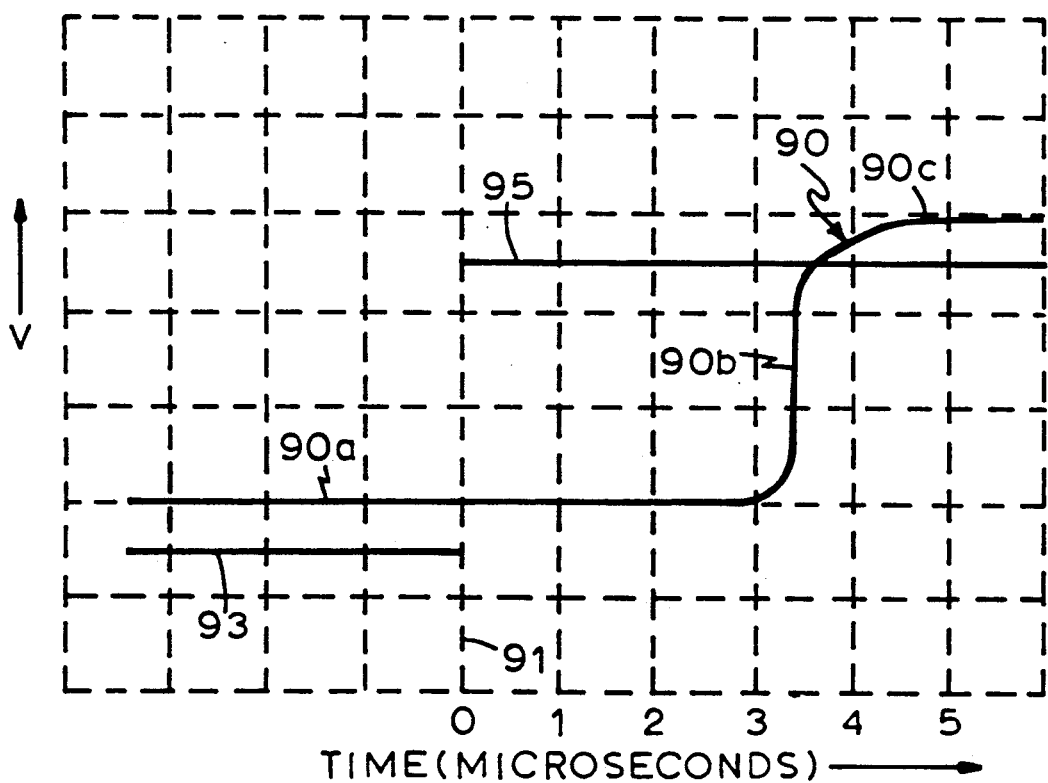
FIG. 4 is a response curve for the over-voltage sensing circuit of FIG. 1.

Referring also to FIG. 2 (a portion of the circuit being shown in broken lines), the circuit of FIG. 1 is reproduced with some slight variations and with test points designated "A" and "B" shown within circles, these test points being utilized for deriving the curves or graphs depicted in FIGS. 3 and 4 to show turn off-times or delay through the circuit of FIG. 2, as tested. The reference numerals in FIG. 2 correspond to the like elements shown in FIG. 1, but the bus sensing circuit 30 and output circuit 40 are omitted. The solid line portion of the circuit 10 of FIG. 2 depicts the single optoisolator circuit previously discussed, that is, an over-voltage sensing circuit employing only one output optoisolator 12. The broken line portion of the circuit of FIG. 2 is that portion added in accordance with the present invention to improve the delay through the circuit, that is, to decrease the delay through the circuit 10. This portion of the circuit adds a second control optoisolator 14 which, as will be described, when conductive, effects a short across the base to emitter resistor 50.

FIG. 2 includes a driver 70 which provides a first signal to optoisolator 14 on lead 32 through resistor 72, and provides a second complementary signal to optoisolator 12 by taking the driver 70 output to the input of an inverter 74 which provides the complementary signal to lead 31 through resistor 76. Thus, devices 70, 72, 74 and 76 are utilized in the test circuit of FIG. 2 to simulate a D type flip flop. The values of the resistors are shown in the figure, that is, resistor 76 has a value of 560 ohms, resistor 72 has a value of 1,500 ohms, and resistors 50 and 52 each have a value of 200,000 ohms. The value of the resistor 61 between voltage source V2 and the collector of transistor 23 is shown to be 4,700 ohms with the voltage source V2 at 15 volts. These values are illustrative of the embodiment illustrated, and it is to be understood that other values of resistance, voltage and the like may be employed with equal results.

Prior to a description of operation of the circuit of FIG. 1, the description of operation of the test circuit of FIG. 2 will be described, first with reference to a single optoisolator 12 and then, with reference to the results obtained with the inclusion of the optoisolator 14. These results are shown hereafter in tabular form in TABLE 1.

The solid line depiction in FIG. 2 represents a prior over-voltage sensing circuit, wherein only one output optoisolator was employed. This would correspond to the upper optoisolator 12 alone, with a resistor 50 coupled between its base and emitter output circuit. The value of the resistor 50 would then influence the turn off time of the circuit, that is, the timing of the output signal to an output circuit similar to circuit 40. Thus, in such a circuit, ideally (ignoring the impact of the base to emitter internal capacitance 60), decreasing the value of the base to emitter resistance would decrease the turn off time.

However, in the use of such a circuit as part of a computer power system over-voltage sensing circuit, consideration must be given to the degradation of the optical isolator with respect to time, a time measured in years. Over a period of time it will be necessary to increase the drive current for the optoisolator to account for this degradation in performance. In such cases, the extra drive current needed is considered as part of the original design with the result being that the optoisolator is driven with a higher current initially to compensate for this anticipated loss. This then brings into play the effect of the internal capacitance 60, which mitigates against a decrease in value of the resistance of the base to emitter resistor as a viable solution to decreasing the turn on time of the optoisolator 12. This increase in drive current results in an increase in the charge of the internal capacitor 60.

In FIG. 2, the internal capacitance 60 is shown in solid lines, and the effect of the increase in drive current will be described. By reference to the drawing, it can be seen that the internal capacitance 60 is effectively in parallel with the resistor 50. With an increase of drive current in the emitter path of the transistor 23, the stored charge on the capacitor 60 is much greater, as a result of which, the discharge time of the capacitor 60 will increase. As the transistor 23 is driven to non-conduction, this effectively results in the stored charge becoming a major detriment to rapid turn-off of transistor 23. The stored charge maintains a voltage level at the base of transistor 23 for a certain time duration after turn-off of the diode 22, which voltage decays slowly in accordance with the R-C time constant as it discharges through resistor 50, until the voltage reduces to a level sufficient to render transistor 23 non-conductive.

On the other hand, taking into consideration the effect of a reduction in value of the base to emitter resistor 50 and the effect of the internal capacitance 60, the net result, below a certain value of resistance, is a decrease in the current transfer ratio of the device. For a typical optoisolator device, the manufacturer's specifications suggest reducing the value of the base to emitter resistor 50 from 1 megohm to 470 k ohms. With use of a Motorola 4N36 optoisolator device, reductions in value of the resistor to a value of 200 k ohms resulted in a reduction of the current transfer ratio to 90%, while a further reduction to 100 k ohms resulted in a current transfer ratio of 80%, with corresponding decreases thereafter.

In such optoisolator circuits, there are counter forces at work. On the one hand, to account for degradation of the optoisolator over its expected useful life, the drive current must be increased, with its corresponding increase on the charge stored on internal capacitance 60, and its attendant negative impact on the switching speed of the optoisolator due to the greater capacitive discharge time. On the other hand, to enhance the electronic switching time, it appears desirable to decrease the value of the resistance of the resistor 50. Unfortunately, decreases in value of the resistor 50 below certain values result in decreases in current transfer ratio.

Viewing only the solid line portion of the test circuit of FIG. 2, in the quiescent state of the circuit, diode 22 of optoisolator 12 is conductive. With optoisolator 12 alone, when the internal light emitted by the light emitting diode 22 is extinguished in response to an increase in the voltage sensed on the bus, its energy is suspended by cutting off the current in light emitting diode 22. With the light extinguished, stimulation for the associated light-sensitive transistor 23 ceases and, ideally, the transistor switches to the so-called cut-off state which exhibits an extremely low base-to-emitter current. The base to emitter current drops to a very low level, while the output voltage goes to a high level. At the time the output voltage goes to a very high level, in this instance +15V, the output sensing circuit is actuated to effect a shut down of the power supply. However, in practical situations there is an internal time delay during the switching to the cut-off state. This delay is occasioned by the internal capacitor 60 as previously discussed.

The following table represents the results achieved from the test circuit of FIG. 2, while FIGS. 3 and 4 graphically depict the results.

TABLE 1

| | DELAYS THROUGH OPTOISOLATOR (usecs.) | |
|---|---|---|
| No. of Tests | optoisolator/ no optoisolator 14 | optoisolator and optoisolator 14 |
| 1 | 53 | 3.3 |
| 2 | 57 | 3.4 |
| 3 | 49 | 3.2 |
| 4 | 51 | 3.3 |
| 5 | 49 | 3.2 |
| 6 | 45 | 3.2 |
| 7 | 52 | 3.4 |
| 8 | 50 | 3.3 |
| 9 | 53 | 3.4 |
| 10 | 53 | 3.3 |

As shown in the table, with the single optoisolator 12 optoisolator 12/no optoisolator 14 configuration, over a run of ten tests, the average time to cut-off of the transistor 23 of optoisolator 12 was approximately 53 microseconds. This effect is graphically illustrated in FIG. 3, where the horizontal scale depicts time, and the vertical scale depicts voltage, including the output voltage of the optoisolator 12, that is, the collector to emitter voltage. Each graduation in the horizontal scale represents 10 microseconds. The curve, generally designated 80, depicts the output voltage of transistor 23. The point designated 81 represents the transition instant of the input signal, that is the transition of the signal appearing on lead 31, from a first state 83 (lower horizontal line segment) to its complementary state 85 (upper horizontal line segment). As can be seen, at about 45 microseconds after triggering the transition, which results in cessation of conduction in the light emitting diode 22, the output voltage, which was initially low at portion 80a, starts rising in accordance with a ramp function at 80b until it reaches a steady state at 80c. The output voltage at which the output sensing circuit 40 reacts is essentially the point at which the curve 80b intersects with the curve 85, which, in this instance corresponds to about 53 microseconds after initiation of the transition of the input signal on lead 31 from a low to a high state.

In accordance with the invention, the second optoisolator 14 is placed in opposing relation to the first optoisolator, that is, the input signal to the second optoisolator 14 is complementary to that of the first optoisolator 12. The second optoisolator 14, as will be seen, functions as a control optoisolator to control the cut-off time of the output optoisolator 12. The output of the second optoisolator 14 is then used to control the resistance in the base to emitter branch of the first optoisolator, that is, to instantaneously reduce the resistance from the stated value of resistor 50 to zero. With the internal capacitance 60 in parallel with resistor 50, this action effectively results in placing a shunt across capacitance 50 as well, thus negating any adverse effect of charge stored on the capacitance 60.

The operation of the circuit of FIG. 1 will now be described. In the normal or quiescent condition, the output of the bus-sensing circuitry 30 places a first signal on lead 31 with its complementary signal on lead 32. These signals are such that optoisolator 12 will be active and optoisolator 14 will be inactive, that is, light emitting diode 22 conducts, providing light which, in turn, causes conduction of transistor 23. This conduction is sensed by the output circuit 40, which includes a pull-up resistor, with the output voltage across leads 41, 43, being low.

When an over-voltage event is in progress, the output of the bus-sensing circuitry 30 asserts a reversal of the dual differential output, or complementary output, on leads 31 and 32 which signals drive both the control optoisolator 14 and the output optoisolator 12. The reversed signal on lead 32 results in a current flowing through diode 24 of optoisolator 14 which causes the diode 24 to emit light while the signal on lead 31 causes current to cease through diode 22 turning off optoisolator 12. This light, impinging on the surface of the light-sensitive transistor 25 causes it to conduct. This conduction effectively produces a shunt across resistor 50, as well as internal capacitance 60, which is in parallel with resistor 50. This results in the collector-emitter output voltage of transistor 25 going to its low state, while the collector-emitter output voltage of the transistor 23 goes to the high state.

The effects of this are shown in TABLE 1, wherein the rightmost column, designated optoisolator 12 an optoisolator depict, in numerical terms the results, with FIG. 4 graphically depicting the effect. As shown in the table, with the dual opposed optoisolators configuration, over a run of ten tests, the average time to cut-off of the transistor 23 of optoisolator 12 was approximately 3.3 microseconds. This effect is graphically illustrated in FIG. 4, where the horizontal scale depicts time, and the horizontal scale depicts voltage, including the output voltage of the optoisolator 12, that is, the collector to emitter voltage. Each graduation in the horizontal scale represents 1.0 microsecond. The curve, generally designated 90, depicts the output voltage of transistor 23. The point designated 91 represents the transition instant of the input signal, that is the signal appearing on lead 31, from a first state 93 (lower horizontal line segment) to its complementary state 95 (upper horizontal line segment). As can be seen, at about 3.0 microseconds after triggering the transition, resulting in cessation of conduction in the light emitting diode 22, the output voltage, which was initially low at portion 90a, starts sharply rising in accordance with a ramp function at 90b until it reaches a steady state at 90c. The output voltage at which the output sensing circuit 40 reacts is essentially the point at which the curve 90b intersects with the curve 95, which, in this instance corresponds to about 3.3 microseconds after initiation of the transition of the input signal on lead 31 from a low to a high state.

In summary, when an over-voltage condition occurs, the drive currents from the bus-sensing circuits 30 will attempt to cut off optoisolator 12, and, simultaneously, to turn on optoisolator 14. Since the optoisolator turn-on characteristics are much faster than the turn-off characteristics, the action provides an instantaneous short circuit across resistor 50 which instantaneously discharges inherent capacitance 60, in turn, forcing the output of transistor 23 of optoisolator 12 into its high state. This is the signal sent to the output circuit 40 over leads 41, 43 which powers down the over-voltaged bus.

Thus, in accordance with the instant invention, by utilization of a second, inexpensive, optoisolator 14, to control the switching speed of the first optoisolator 12 and negate any effect of its internal capacitance 60, significant reductions in cut-off state of the output optoisolator 12 are obtained. Numerically, this inexpensive modification results in a reduction by a factor of about 17:1, that is, from fifty microseconds to about 3.3 microseconds, thus providing virtually instantaneous response of the output circuitry 40 to over-voltage conditions sensed by the bus sensing circuitry 30. The use of optoisolators, as aforesaid, also provides for electrical isolation between boards, thus providing a high speed effective over-voltage sensing circuit.

Although the above description has proceeded with reference to the circuitry being utilized in an over-voltage sensing arrangement, it is to be understood that the circuitry may be used in other applications in which it is desired to instantaneously effect a resulting change in one circuit as a consequence of a sensed condition in another circuit where electrical isolation of the two circuits is desirable.

While there has been shown and described a preferred embodiment, it is to be understood that various other adaptations and modifications may be made within the spirit and scope of the invention.

We claim:

1. Apparatus for controlling a circuit of an electronic apparatus in response to sensing of an electrical condition, said apparatus comprising:
    means for sensing the electrical condition and for providing complementary output signals;
    means for effecting control of said circuit;
    output means responsive to a state transition of one of said complementary signals for providing an input to said means for effecting control of said circuit; and
    control means responsive to the other of said complementary signals upon said state transition for effecting instantaneous response of said means for effecting control of said circuit.

2. The apparatus according to claim 1 wherein said circuit is a voltage supply circuit, and the sensed electrical condition is an over-voltage condition.

3. The apparatus according to claim 2 wherein said output means is an optoisolator means for electrically isolating said sensing means from said means for effecting control of said voltage supply circuit.

4. The apparatus according to claim 3 wherein said optoisolator means includes a semiconductor output portion having a resistor, the value of said resistor determining, at least in part, the response characteristics of said optoisolator means.

5. The apparatus according to claim 4 wherein said control means effects a shunt across said resistor in response to receipt of the other of said complementary signals upon said state transition.

6. A circuit for shutting down a power supply means of an electronic device in response to sensing of an over-voltage condition comprising:
    means for sensing an over-voltage supply condition and for providing complementary output signals;
    optoisolator means for effecting operation of the power supply means;

output means responsive to a state transition of one of said complementary signals for providing an input of said optoisolator means;

means responsive to the other of said complementary signals upon said state transition for effecting instantaneous response of said means for effecting operation of said power supply means thereby instantaneously shutting down said power supply means.

7. The circuit according to claim 6 wherein said optoisolator means includes a light emitting diode portion and a transistor portion, said transistor portion including a resistance means in the base to emitter circuit thereof, and wherein said means responsive to the other of said complementary signals provides a shunt across said resistance means for enabling instantaneous transition of said transistor portion from conduction to non-conduction.

8. The circuit according to claim 7 wherein said control means is a second optoisolator means.

9. Electronic apparatus for shutting down a power supply means of an electronic device in response to occurrence of an over-voltage condition, said apparatus comprising:

means for monitoring the voltage of the power supply means for providing complementary outputs, said monitoring means providing a first state condition with normal voltage and changing to a second state condition in response to the sensing of an over-voltage supply condition;

a first optoisolator device having a light emitting diode portion and a transistor portion, said diode portion being coupled for actuation in response to one of said complementary outputs for rendering said transistor portion conductive in response to a first state condition, said transistor portion including a resistance means in the base to emitter circuit thereof with the output voltage across said base to emitter being low during conduction;

a second optoisolator device having a light emitting diode portion and a transistor portion, said diode portion being coupled for actuation in response to the other of said complementary outputs, the transistor portion of said second optoisolator device having the output thereof coupled across said resistance means, the coupling of said first and second optoisolator devices to said complementary outputs being such that with one of said optoisolator devices conductive, the other is non-conductive;

power supply control means operable in response to the output voltage of the transistor portion of said first optoisolator device, transition of said monitoring means to said second state condition rendering said second optoisolator device conductive for shorting said resistance means for enabling shutting down of said power supply means.

10. A computer over-voltage sensing circuit comprising:

means monitoring the bus of the computer for sensing the voltage thereon and for providing first and second complementary signals, the state of which change in response to transition from a normal voltage condition to an over-voltage condition;

power supply control means;

optoisolator means having the output thereof coupled to said power supply control means, said optoisolator means being responsive to one of said complementary signals for being rendered conductive during a normal voltage condition;

other means coupled across the output of said optoisolator means and responsive to the other of said complementary signals for instantaneously rendering said optoisolator means non-conductive in response to transition of the state of said monitoring means indicative of an over-voltage condition.

11. The circuit of claim 10 wherein said optoisolator means has a transistor portion which includes resistance means in the base to emitter path thereof and said other means shorts said resistance means in response to transition of the state of said monitoring device.

12. A method for controlling a power supply means of an electronic device in response to sensing of an over-voltage condition comprising:

monitoring the voltage of said electronic device for providing complementary signals of a first state in response to a normal voltage condition and a second state in response to an over-voltage condition;

controlling first and second optoisolator devices in opposite conductive states with each such device being responsive to one of said complementary signals;

shunting resistance means in the output circuit path of said first optoisolator device by said second optoisolator device on transition to said second state; and operating the power supply means in response to the state of conduction of said first optoisolator means.

13. A method for controlling a circuit of an electronic device in response to a sensed electrical condition of said circuit comprising:

monitoring the electrical condition of said electronic device for providing complementary signals of a first state in response to a normal condition and in a second state in response to an abnormal condition;

controlling first and second optoisolator devices in opposite conductive states with each such device being responsive to one of said complementary signals;

shunting resistance means in the output circuit path of said first optoisolator device by said second optoisolator device on transition to said second state; and operating the circuit of the electronic device in response to the state of conduction of said first optoisolator means.

* * * * *